United States Patent
Tamagaki et al.

[11] Patent Number: 5,126,030
[45] Date of Patent: Jun. 30, 1992

[54] APPARATUS AND METHOD OF CATHODIC ARC DEPOSITION

[75] Inventors: Hiroshi Tamagaki, Kobe; Koichiro Akari, Urawa, both of Japan

[73] Assignee: Kabushiki Kaisha Kobe Seiko Sho, Kobe, Japan

[21] Appl. No.: 625,013

[22] Filed: Dec. 10, 1990

[51] Int. Cl.⁵ .............. C23C 14/24; C23C 14/32
[52] U.S. Cl. .............. 204/192.38; 204/298.41; 427/37
[58] Field of Search ........ 204/192.38, 298.41; 427/37

[56] References Cited

U.S. PATENT DOCUMENTS

| | | | |
|---|---|---|---|
| 4,452,686 | 6/1984 | Axenov et al. | 204/298.41 |
| 4,512,867 | 4/1985 | Andreev et al. | 204/298.41 |
| 4,551,221 | 11/1985 | Axenov et al. | 204/298.41 |
| 4,563,262 | 1/1986 | Sablev et al. | 204/298.41 |
| 4,645,895 | 2/1987 | Boxman et al. | 219/76.13 |

OTHER PUBLICATIONS

A. S. Gilmour, Jr. et al., *Proceedings IEEE*, vol. 60, No. 8, Aug. 1972, p. 983.

*Primary Examiner*—Aaron Weisstuch
*Attorney, Agent, or Firm*—Oblon, Spivak, McClelland, Maier & Neustadt

[57] ABSTRACT

Cathodic arc deposition method and apparatus, including an arc evaporation source containing a film forming material. A substrate is arranged on the central axis line of and in front of the evaporation surface of the arc evaporation source. At least one magnet coil is arranged around the central axis line and between the arc evaporation source and the substrate.

18 Claims, 8 Drawing Sheets

APPARATUS AND METHOD OF CATHODIC ARC DEPOSITION

BACKGROUND OF THE INVENTION

1. Field of the Invention

The present invention relates to a cathodic arc deposition method and apparatus more particularly to a cathodic arc deposition method and apparatus used for forming a wear resistant coating on cutting tools, bearings, gears and the like, and for film formation in the fields of electronic parts, printed circuits, optics, and magnetic devices.

2. Prior Art

Cathodic arc deposition principally includes generating a vapor emission of a film material from an evaporation source (cathode) by arc discharge in a vacuum chamber, and depositing the vapor on a substrate under the application of a negative bias voltage. One or more arc spots, where the arc discharge current is focused, are formed on the evaporation surface of the evaporation source, which is the cathode in an arc discharge circuit. From an arc spot, ions, neutral atoms, macroparticles of source material, and electrons are emitted in a beam due to the high current density at the arc spot. Ions of source material, which form a plasma together with the emitted electrons, are the species of primary importance in the film deposition. One characteristic feature of cathodic arc deposition is that the energy of the incident evaporated ions is high enough to produce a high-density film with excellent hardness and wear resistance. More than that, the rapid film formation and high productivity of the technique has been industrial application.

The following show examples of prior art cathodic arc deposition.

Prior Art Example 1, Japanese Patent Publication No. 3033/1983

An arc discharge is generated between an evaporation source material as a cathode and an anode electrode in a vacuum chamber, thereby emitting a beam of vapor composed of atoms and ions of the evaporation source material. An arc discharge current of about 50 to 300 amperes is supplied at a low voltage of 100 volts or less to give each ion kinetic energy of about 10 to 100 electron volts, thereby depositing the ions on the surface of the substrate. An anode is formed cylindrically in the form of a circular truncated cone in order to enhance beam directivity, thereby determining beam direction. The beam width is regulated by controlling the opening degree and enlarged diameter angle thereof. Furthermore, it also describes that the utilization of a magnetic field is effective for enhancing the directivity.

Prior Art Example 2, Japanese Patent Publication No. 14690/1977

A vacuum metal coating apparatus is provided with a metallic cathode as an evaporation source arranged in a cooling bed, a trigger electrode to generate a cathodic arc spot on an evaporation surface of the cathode, a discharge chamber and an anode electrode. The anode is an envelope, and the evaporation surface of the cathode faces the space inside the envelope. The confinement device of the arc spot controls the evaporation surface of the cathode and is arranged near the cathode in such a manner as to prevent the arc spot from transferring from the evaporation surface of the cathode to the non-evaporation surface thereof. Due to this structure, the arc stability and utilization rate of cathode materials are improved.

Prior Art Example 3

Current cathodic arc deposition devices including the two described above have problems concerned with the emission of macroparticles. The macroparticles, melted droplets of source material, which are larger than emitted ions and atoms, are emitted from the arc spot, and contaminate the deposition film on a substrate, leading to the deterioration of the film surface roughness and the decrease in adhesiveness of the film. Also the macroparticles which are unreacted are incorporated into a reactive coating film.

Figure 11:
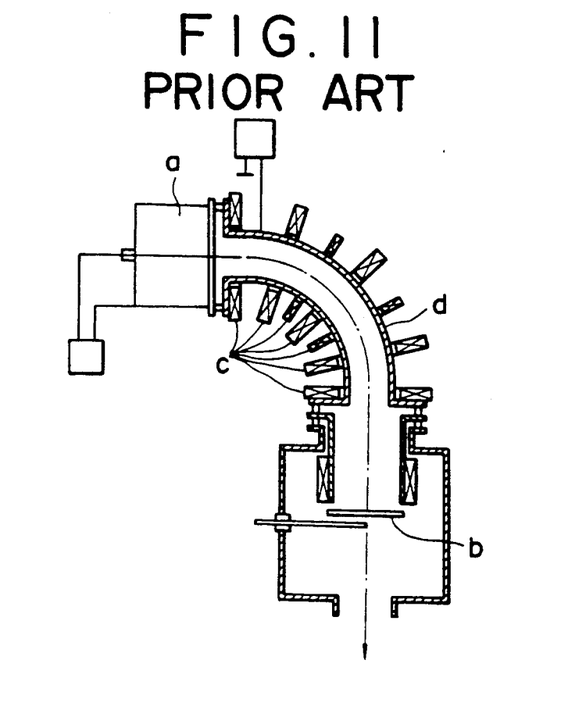
FIG. 11 is a vertical longitudinal sectional side view of the apparatus of the prior art example (3)

In order to solve these problems, the prior art suggests using an apparatus utilizing a magnetic field, shown in FIG. 11, wherein a conduit d, on which are arranged solenoids c and which is kept under vacuum, connects a cathodic arc evaporation source a to a substrate b while being curved rectangularly. The plasma generated from the evaporation source is curved by the action of the magnetic field excited by the solenoids c and travels curving into the conduit d to be introduced onto the substrate b. Alternatively, the macroparticles travel straight without being influenced by the magnetic field, and therefore the macroparticles do not reach the substrate b at an optically shaded position, whereby a high-quality film not containing macroparticles can be formed.

Prior Art Example 4, Japanese Patent Publication No. 36468/1985

Figure 12:
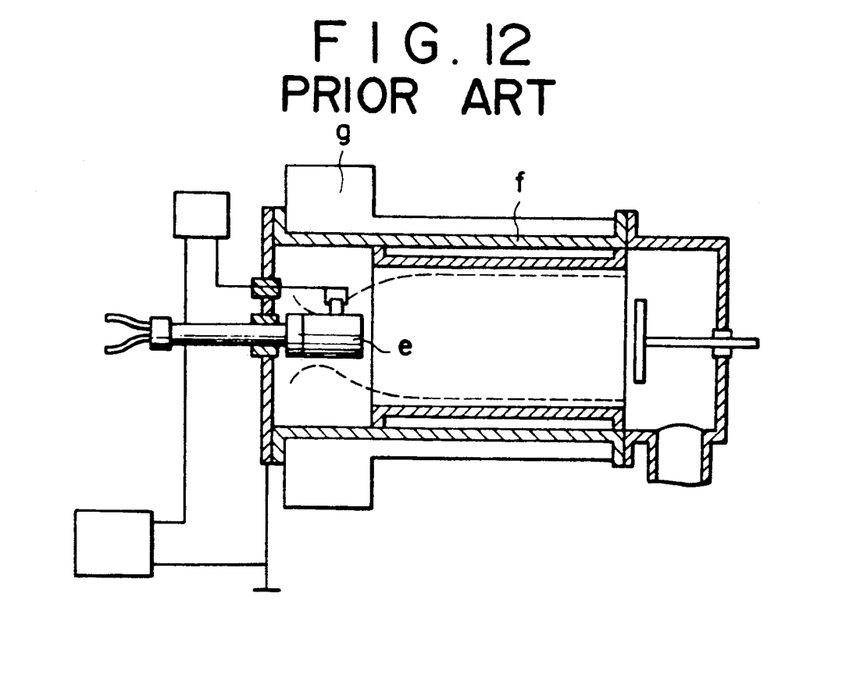
FIG. 12 is a vertical longitudinal sectional side view of the apparatus of the prior art example (4).

Another embodiment of the cathodic arc deposition apparatus utilizing a magnetic field, is characterized, as is shown in FIG. 12, by a tubular anode f arranged in front of a cathodic evaporation surface e and solenoids g arranged outside the tubular anode f. The number of turns of a solenoid per unit length of the circumference of the evaporation surface is two fold or more the number thereof on the other parts, whereby the magnetic field is focused on the cathode as is depicted in dotted line. The action based on the size and form of such a magnetic field can realize the efficient utilization of the evaporated material because of the arc stability and the plasma-inducing effects of the magnetic field.

In the cathodic arc deposition apparatus of prior art example 3), the aforementioned problem that macroparticles might mix into a deposited film can be avoided. As is shown in the figure, however, the apparatus has only a small utilizing space though it is of a large and complex type, involving difficulty in controlling the practice thereof. Furthermore, its effective coating area is so small that the apparatus is not suitable for practice on an industrial scale.

It is assumed that the prior art example 4 may be more practical than the example 3, but the neutral components of the evaporated materials reach a substrate in the same manner as in the conventional techniques. Therefore, the problem that macroparticles might contaminate a deposited film remains unsolved.

SUMMARY OF THE INVENTION

One object of the present invention is to solve the problems described above concerning the prior art cathodic arc deposition apparatuses. Another objective of the present invention is to provide a modified cathodic arc deposition apparatus, by which the problem of deposited film deterioration due to contaminated macroparticles from an evaporation surface can be reduced to a minimum, with the apparatus having the requirements for an industrial, economical apparatus, and by which the features of cathodic arc deposition technique are realized without any troubles.

In order to solve the problems described above and satisfy the requirements for cathodic arc deposition apparatus, the present invention provides a modified cathodic arc deposition apparatus, comprising an arc evaporation source containing a film forming material, a substrate arranged on the central axis line of and in front of the evaporation surface of the arc evaporation source, and one or more magnet coils arranged around the central axis line and between the arc evaporation source and the substrate. The arc spot generated on the evaporation surface is rotated circularly at a high velocity through the magnetic field generated by the excitation of the magnet coils and the plasma generated by the arc spot is passed through the vacuum space inside the magnet coils to be introduced onto the substrate. The present invention also provides a cathodic arc deposition method, comprising the steps of arranging an arc evaporation source containing a film forming material and a substrate in a vacuum chamber, generating a magnetic field toward the evaporation surface of the arc evaporation source so that magnetic lines of force can diverge outwardly from the center of the evaporation surface, generating an arc spot on the evaporation surface of the arc evaporation source, circularly rotating the arc spot at a high velocity on the evaporation surface of the arc evaporation source, through the magnetic field, and introducing the plasma generated by the arc spot, to the substrate along the magnetic lines of force of the magnetic field.

The technical basis of the apparatus of the present invention will now be explained, based on the principle of action and with reference to the structure of the apparatus.

Figure 1:
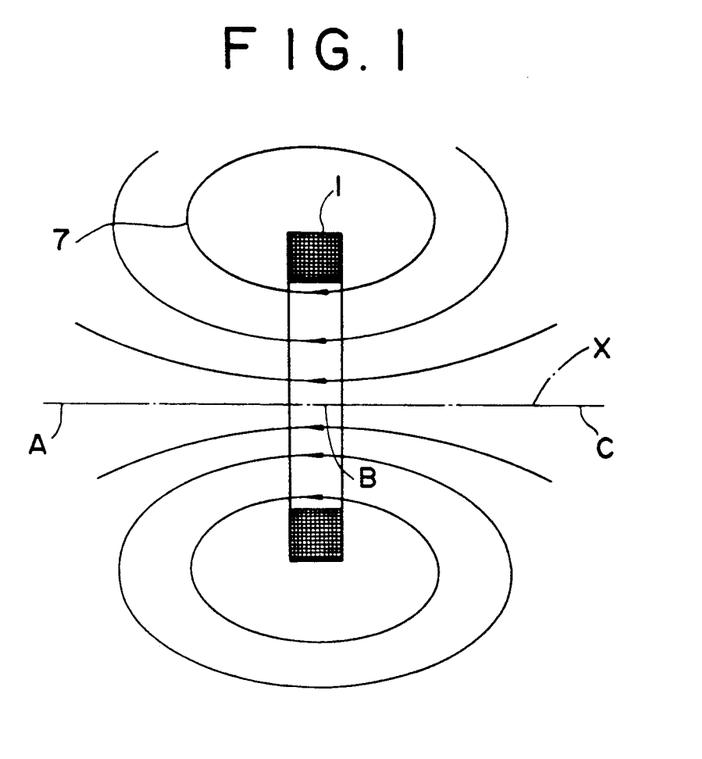
FIG. 1 is a figure showing the forming of a magnetic field with an magnet coil, in order to explain the principle of the present invention.

When a magnet coil 1 is energized, as is shown in FIG. 1, the magnetic lines of force from a magnetic field are almost parallel to a central axis line x at a position B inside the coil, when there is no ferromagnetic material around the magnet coil. But the magnetic lines of force 7 from the magnetic field diverge in the radial direction outwardly from the axis line x, as the magnetic lines of force 7 depart from the both edges of the coil, and they are consequently connected to the magnetic lines of force on the outside of the coil.

The present invention provides a structure in which the evaporation surface of a cathodic arc evaporation source is arranged at a position A where a magnetic field diverges outwardly, whereby an evaporate plasma flow is introduced along the magnetic lines of force to pass the position B inside the coil to reach a substrate arranged on an opposite position C for coating.

Figure 2:
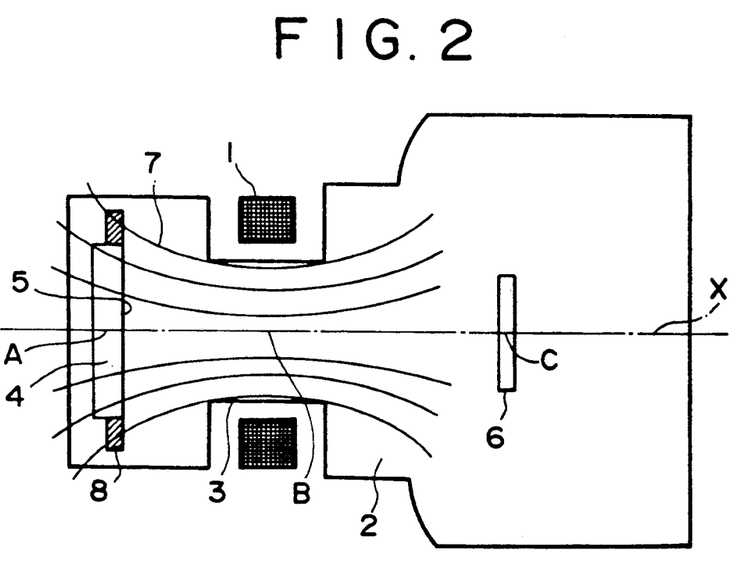
FIG. 2 is a schematic view of the structure of the cathodic arc deposition apparatus of the present invention.

FIG. 2 schematically depicts the structure of a cathodic arc deposition apparatus, where a cathodic arc evaporation source 4 is arranged at a position A inside a vacuum chamber 2 with the center of the evaporation surface 5 at the central axis line x, and a substrate 6 is arranged at a position C. A magnet coil 1 is arranged at a position B outside a tubular part 3 in a vacuum chamber 2 made of non-magnetic materials. As shown in FIG. 2, the tubular part may be constricted so that the inner diameter thereof is smaller than the diameter of the evaporation surface. Magnetic lines of force are represented by 7. An arc confinement ring to stabilize an arc is represented by 8.

When a magnetic field is applied to a plasma, the plasma generally shows the property of easily moving in the direction along magnetic lines of force and hardly moving in the direction orthogonal to the magnetic lines of force. This property is exhibited through the effect of so called Larmor gyration, where a charged particle moves in a winding motion around a magnetic line of force when the charged particle moves in a magnetic space. In order to introduce a plasma by utilizing this effect, a magnetic field of several tens of Gauss capable of trapping electrons may be applied, because ions move toward the region of higher negative-charge electron density, just by introducing the electrons in the plasma through a magnetic field.

Consequently, the plasma generated on the evaporation surface 5 of a cathodic arc evaporation source 4 flows along magnetic lines of force 7 shown in the figure to reach a substrate 6.

The effect acts to relatively decrease macroparticles moving toward a substrate. That is, such inducing effect will not act on neutral macroparticles, while ions are selectively introduced toward the substrate due to the effect.

According to the present invention, an arc evaporation source is arranged at a position where magnetic lines of force of a magnetic field from the edges of the coil diverge outwardly along the radial direction, contrary to the prior art example (4), where an arc evaporation source is arranged at a position on which a magnetic field focuses. The outwardly diverging magnetic field has components in the radial direction, namely, the components parallel to the evaporation surface. The components orthogonally cross the flow of ions and electrons emitted from an arc spot of the arc evaporation source, and compulsorily move the arc spot due to the electromagnetic force, whereby the arc spot rotates circularly on the evaporation surface at a high velocity. As a result, the period of time during which the arc spot resides at a certain position shortens and the generation of melted parts around the circumference of the arc spot is thus suppressed, thereby decreasing the generated amount of macroparticles generated on the evaporation surface and inducing the action to reduce the size of macroparticles.

Based on the concurrence of the two actions hereinabove described, the present invention achieves the reduction of contamination of macroparticles into a film, by moving an arc spot at a high velocity with an outward magnetic component toward the radial direction to generate a plasma with fewer macroparticles contaminated from an evaporation surface, and furthermore, by selectively introducing only ions with the magnetic field.

Still further, the present invention has an advantage that a plasma flow can be obtained in a focussed state. In other words, a plasma flow is introduced along magnetic lines of force to be focussed once, to a smaller size than the size of an evaporation surface, on a spatial position inside of a coil, and then the flow diverges again. If a substrate is then arranged close to the coil, the substrate can be coated with the plasma flow focussed on a small area at a high density.

There is no limitation on the form, size, and coating portion of a substrate to be coated. If the substrate is for example a drill, the important part to be coated is its blade tip only, which is therefore arranged close to the coil so as to utilize the action of a focussed plasma. When coating over a large area is required, a substrate is arranged considerably apart from the coil to utilize a plasma flow which spreads along a magnetic field.

As for the focussing of a plasma flow, evaporated ions essentially expand from an evaporation surface and diverge according to the prior arts 1 and 2, and a plasma flow also expands from an evaporation surface while moving along magnetic lines of force according to the prior art 4.

Furthermore, another advantageous action, which is concurrently obtained by the present invention, is an action to uniformly consume an evaporation material, based on the rapid circular rotation of an arc spot on the evaporation surface, thereby making the arc spot move all over on the evaporation surface.

In prior art examples 1 and 2, an arc spot sometimes resides only at a certain part on the evaporation surface thereby tending to facilitate the consumption of the part, when no specific control is applied. In order to control the tendency, a method is known to deliberately move an arc spot, by arranging a coil at the back of an evaporation material to form a magnetic field similar to that of a planar magnetron sputter cathode. According to the present invention, an evaporation material is uniformly consumed without establishing such a specific system.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 3A:
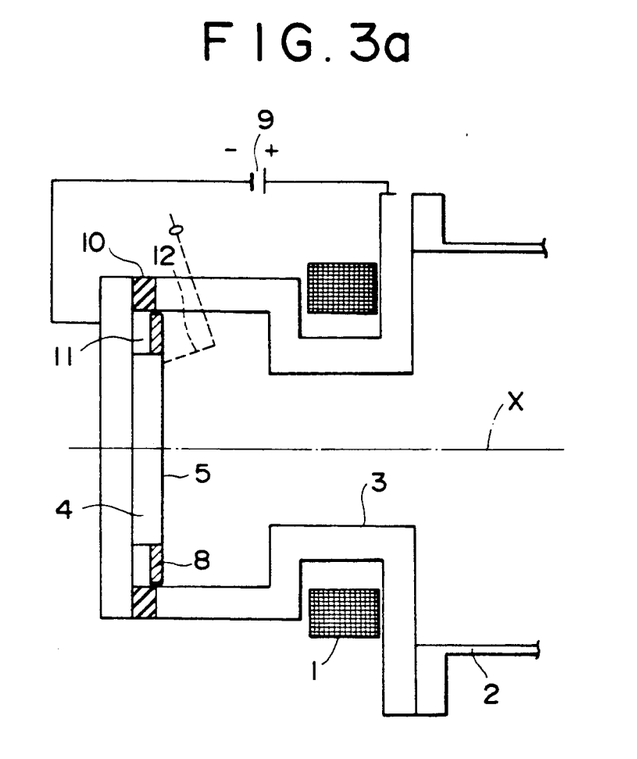
FIG. 3a is a partially enlarged vertical longitudinal sectional side view of the elements of an embodiment of the cathodic arc depostion apparatus of the present invention.

Various other objects, features and attendant advantages of the present invention will be more fully appreciated as the same becomes better understood from the following detailed description when considered in connection with the accompanying drawings in which like reference characters designate like or corresponding parts throughout the several views and wherein:

FIG. 3 illustrates elemental members of an example of the cathodic arc depostion apparatus of the present invention. As FIG. 3a corresponds to the schematic view of FIG. 2, the equivalent parts between them are represented with the same symbols, in order to help the explanation.

For complementary explanation, a Ti cathodic arc evaporation source 4 is connected to the negative side of an arc power source 9, and a boron nitride arc confinement ring 8 is arranged on the circumference of the arc evaporation source 4. The cathodic arc evaporation source 4, which is insulated from a vacuum chamber 2 connected to the positive side of the evaporation source 9 by an insulating material 10, is mounted on a cathode holder 11 having a water-cooling system, arranging the evaporation surface of the cathodic arc evaporation source toward the front face of the side of the vacuum chamber 2. An arc ignition device is represented by 12. In this example, a single electromagnetic coil 1 is arranged along the central axis line x, coaxial with and outside the tubular part 3 of the chamber, and between the evaporation surface and a substrate 6 not shown because it is outside of the figure. But a multiplicity of coils may be also arranged. The plasma generated on the evaporation surface is introduced, through the tubular part 3 which works also as the anode at the inside of the coil, into a substrate 6 inside the chamber.

The numerical figures in the present example are: 100 mm diameter of the evaporation surface 5 of the cathode of the evaporation source, 184 mm diameter of the central diameter of the coil 1, and 80 mm of the distance from the coil edge to the cathodic evaporation surface.

Figure 4:
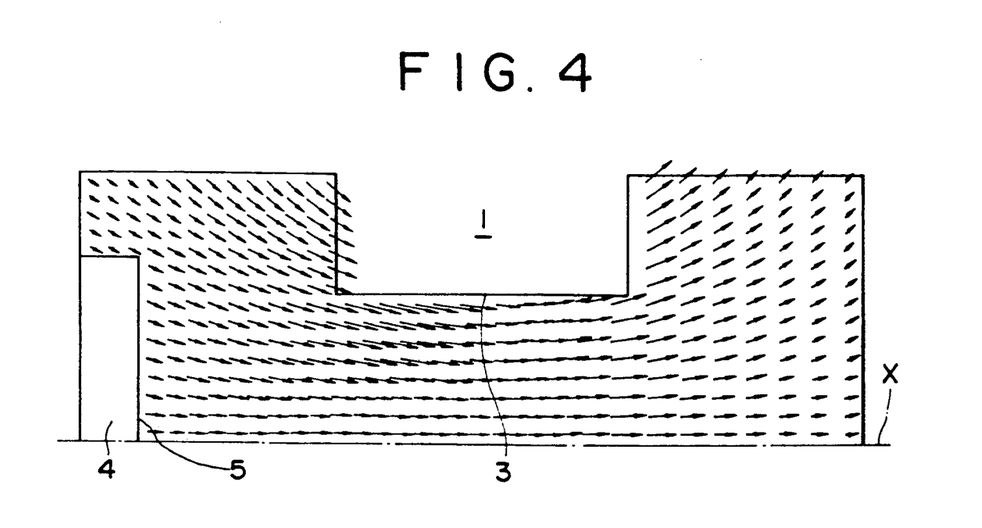
FIG. 4 is a figure representing the distribution form of a magnetic field at the excitation of coils, according to the present invention.

The form of the magnetic field when the coil is energized with 3000 AT, is depicted in FIG. 4, and the intensity of the magnetic field at each position is shown in Gauss units in Table 1.

TABLE 1

| | Intensity of magnetic field at each position (Unit, Gauss) | |
|---|---|---|
| Position | Component of axial direction | Component of radial direction |
| Coil center | 200 | 0 |
| Cathode center of evaporation source | 68 | 0 |
| Position of a 35 mm radius on evaporation surface | 60 | 20 |
| Position of a 50 mm radius on evaporation surface (maximum radius) | 53 | 26 |

As is identified in Table 1, the components of the magnetic field toward the radial direction on the cathodic evaporation surface 5 are not homogeneous. That is, the component toward the radial direction essentially equals zero due to the symmetrical form of the magnetic field on the central axis line x, while the components closer to the circumference get larger. Herein, the position of a 35 mm radius corresponding to 70% of the outer diameter of the evaporation surface (where the inner area nearly equals the outer area) is regarded as a representative point, and the operating status is explained.

It is known from FIG. 4 and Table 1, that the magnetic lines of force energized with a coil diverge as they are spaced apart from the central axis line x, and consequently they possess components along the radial direction on the cathodic evaporation surface.

When a cathodic arc discharge is generated in the apparatus described above through an arc ignition system 12, under the supply of electric power from an arc power source 9, it is visually observed that a plasma flow is introduced from the evaporation surface 5 along the magnetic lines of force. In other words, the luminous part of the plasma flow generated from the evaporation surface, focuses up to about 60% of the diameter of the evaporation surface along the magnetic field inside the coil, and then the luminous part diverges into the inside of the opposite side of the vacuum chamber. The arc spot on the evaporation surface 5 at this point is in circular motion at a high velocity.

Figure 5:
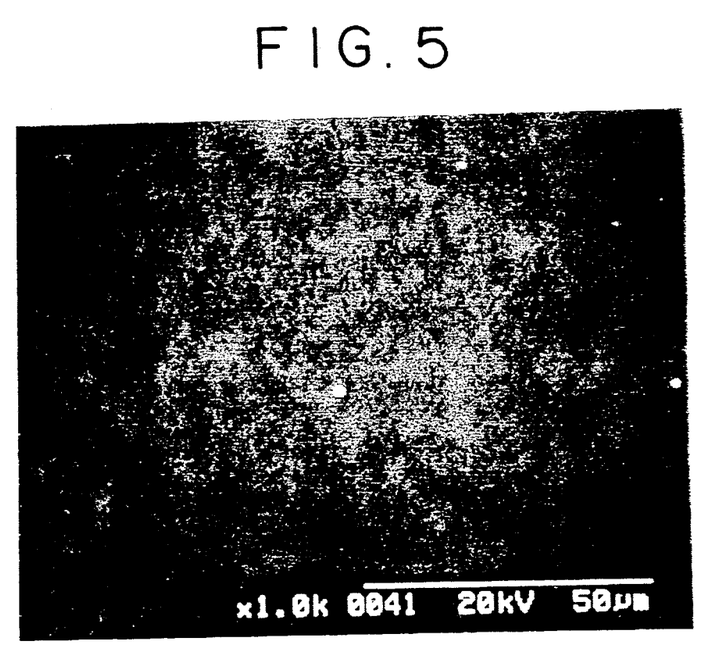
FIG. 5 is a scanning electron microscopic (SEM) photograph of a film formed at an excitation of 3000 AT with the apparatus of the present invention.
Figure 6:
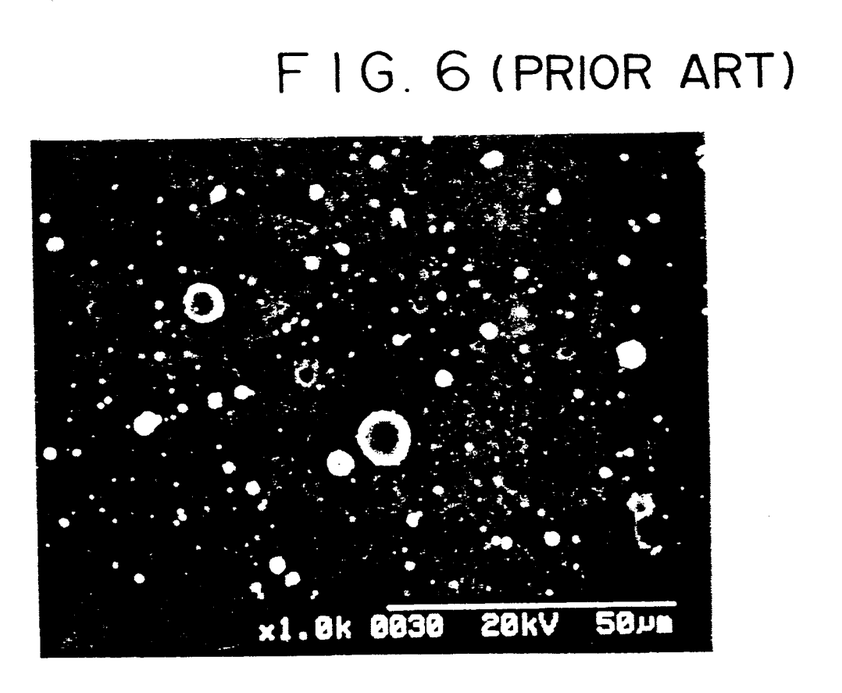
FIG. 6 is an SEM photograph of a film formed according to the prior art.

When a reactive cathodic arc deposition of TiN film was practiced, using the apparatus where a substrate 6 made of SUS 304 stainless steel was arranged at a position 350 mm apart from an evaporation surface 5 and being exactly opposite thereto, under operating conditions such as 3000 AT excitation current of the coil 1, 100 A arc current, −50 V substrate bias voltage, and $N_2$ gas pressure of 10 m Torr inside the vacuum chamber 2, there was achieved an excellent coating of about 2.5 μm thick film with less contamination of macroparticles such as is shown in the film photograph of FIG. 5 by a scanning electron microscope (SEM). For comparison, the SEM photograph of FIG. 6 represents the coated film according to the conventional technique corresponding to prior art examples 1 and 2, wherein the same conditions as is described above were employed, except that a substrate was arranged at a position 200 mm apart from the evaporation surface where a deposition rate almost the same as that described above could be obtained. On comparison with the film of FIG. 6, it is demonstrated that a remarkably fine result is obtained according to the present invention.

Regarding the film of the present invention and the film of the Comparative Example, surface roughness (Ra value) was measured and the density of macroparticles of a diameter of 0.6 μm or more was calculated through the image processing of the SEM images of the film. The results obtained are shown in Table 2.

TABLE 2

|  | Surface roughness (Ra) | Macro-particle density |
|---|---|---|
| Film (TiN) of the present invention | 0.02 (μm) | 900/mm$^2$ |
| Film (TiN) of the prior art | 0.12 (μm) | 8500/mm$^2$ |

The results indicate, based on the numerical data, that the present invention can attain a remarkable improvement in the surface roughness and almost one-tenth reduction of macroparticles.

Comparing the present invention with prior art example 3 which can prevent macroparticles from contaminating a film, the apparatus of the present invention has a simple structure of a small type, to make it industrially useful.

In order to examine the relation between the contamination of macroparticles into a film and the intensity of a magnetic field, a coating was carried out by changing the coil excitation at 0 AT, 1000 AT and 2000 AT. It was observed that the increase in the excitation caused the rotational movement of an arc spot on the evaporation surface to have a higher velocity. Furthermore, each excitation resulted in the photographs of SEM images of the film, shown in FIGS. 7, 8 and 9.

Figure 7:
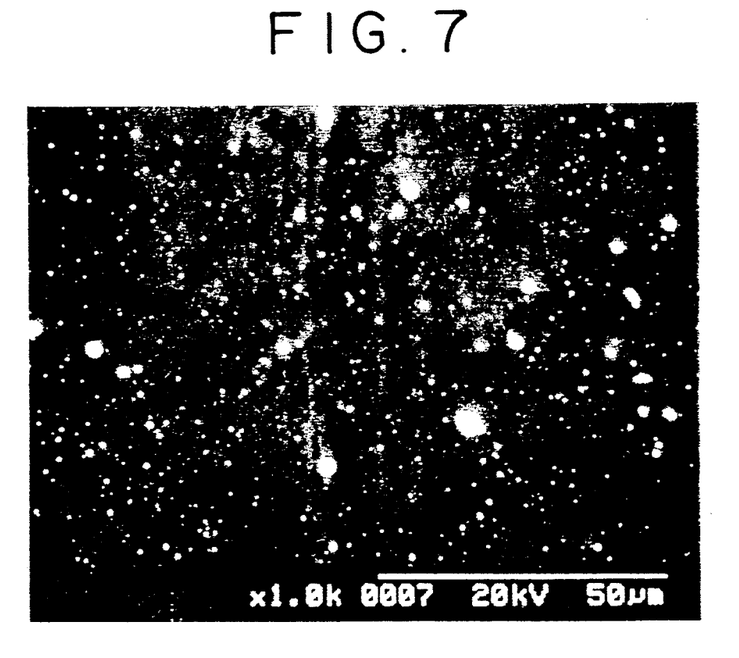
FIG. 7 is an SEM photograph of a film formed without excitation with the apparatus of the present invention.
Figure 8:
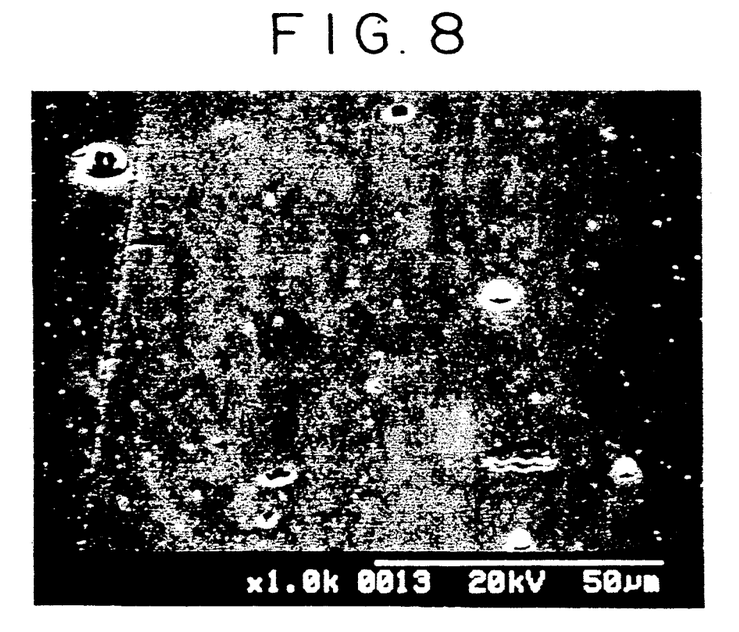
FIG. 8 is an SEM photograph of a film formed at 1000 AT excitation with the apparatus of the present invention.
Figure 9:
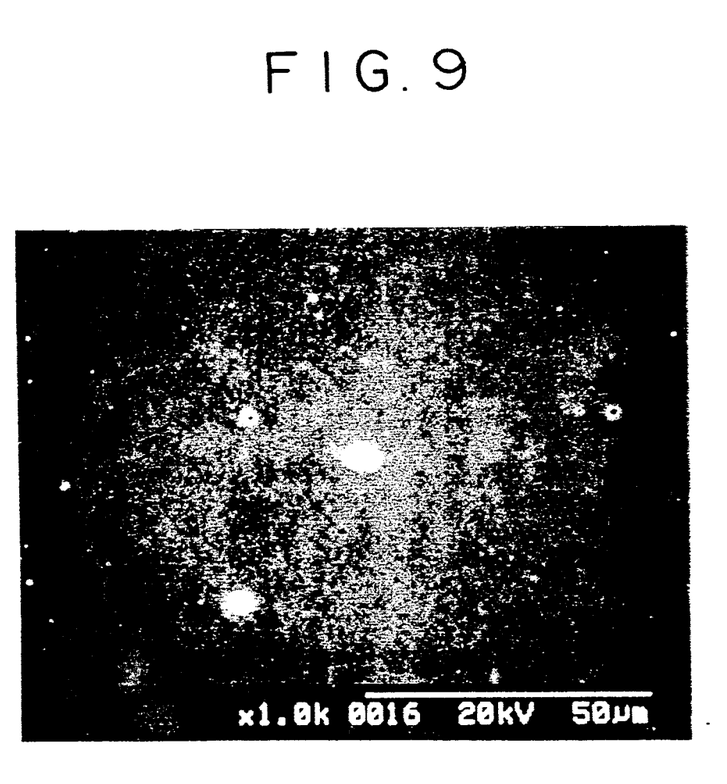
FIG. 9 is an SEM photograph of a film formed at 2000 AT excitation with the apparatus of the present invention.

The contamination of macroparticles was serious in the case without coil excitation, as is shown in the photograph of FIG. 7. In the case of the excitation of 2000 AT, the contamination of macroparticles was less, as is shown in the photograph of FIG. 9, and the outcome is almost the same as in FIG. 5 representing the case of the 3000 AT excitation. In the case of 1000 AT excitation, as is shown in the photograph of FIG. 8, the contamination of macroparticles was of a lower degree than in the nonexcitation case of FIG. 7, but there still remain a number of macroparticles of a large particle size. This indicates that the excitation of 1000 AT to 2000 AT facilitates the reduction in macroparticles. The radial components of magnetic field on the evaporation surface, at 1000 AT and 2000 AT, are about 7 Gauss and 13 Gauss, respectively, and it is thus determined that the reduction in macroparticles may be promoted if the radial component of the magnetic field exceeds about 10 Gauss.

Figure 10:
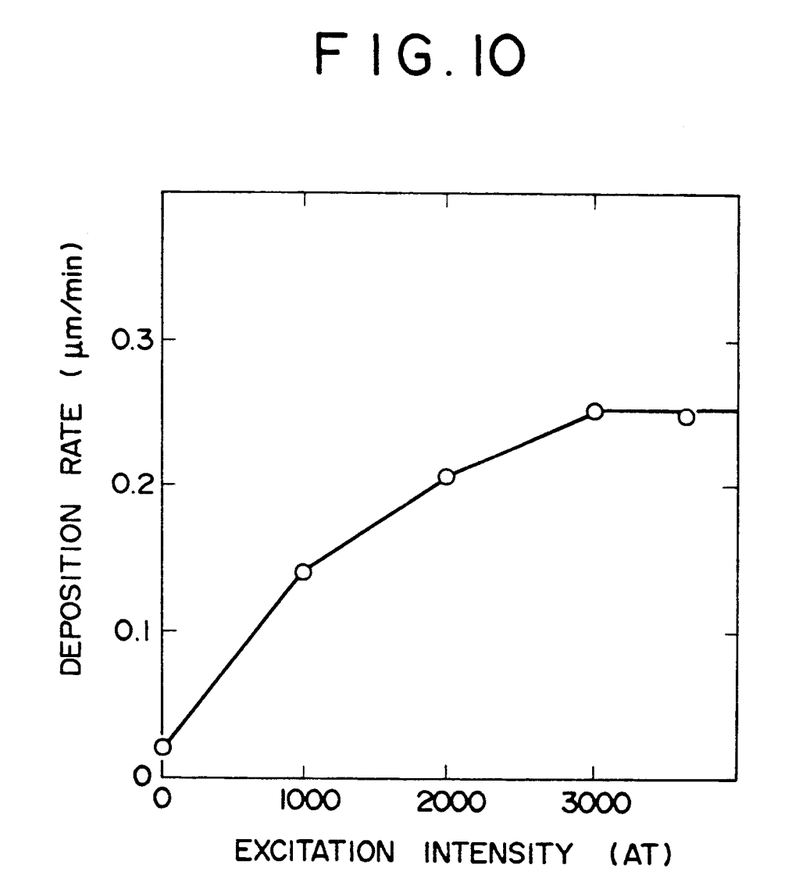
FIG. 10 is a graph representing the relationship between the excitation intensity and the deposition rate.

From the viewpoint of efficiently introducing a plasma onto a substrate according to the present invention, the effects of an excitation electric current on deposition rate were examined, and the results are shown in FIG. 10. FIG. 10 indicates that the deposition rate increased as the excitation intensity was enhanced. However, there is observed a tendency that the deposition rate saturates at 3000 AT or greater.

The tendency of such phenomenon can be explained in terms of the following physical phenomenon. When a magnetic field is applied, an electron is trapped onto a magnetic line of force by the Larmor gyration, whereby its movement is limited to the motion parallel to the magnetic line of force. In order to utilize such phenomenon, the radius of the Larmor gyration hereinabove described is sufficiently small enough compared with the size of the apparatus, for example, the diameter of the evaporation surface. The Larmor radius is expressed in the formula; $mV\perp/eB$ (wherein m: electron mass; $V\perp$: electron velocity; e: elementary quantity of electron; B: intensity of a magnetic field). That is, as the Larmor radius is in inverse proportion to the intensity of a magnetic field, the Larmor radius gets smaller if the intensity of a magnetic field gets stronger with excitation, so that electrons are to be trapped more intensely into the magnetic field.

The Larmor radius is calculated to be about 2.5 mm at the magnetic field of 60 Gauss at a position close to the evaporation surface when excited at 3000 AT, provided that the electron immediately after emission has the energy of about 20 eV corresponding to the discharge voltage. The diameter of the Larmor gyration is about one-twentieth of the diameter of the evaporation surface. It is thus concluded that the electron is successfully trapped by the magnetic field.

It is difficult to absolutely determine what degree of a magnetic field is appropriate to be applied, because other conditions for practice should be considered. On judging from FIG. 10 indicating the tendency that the deposition rate is saturated at 3000 AT and dramatically improves from 0 to 1000 AT, it is determined that an excitation of at least 1000 AT or more is required and the excitation at 3000 AT is preferable. Because the magnetic field gets weakest close to the evaporation surface due to divergence thereof and consequently the Larmor radius reaches a maximum, it is judged that a magnetic field of at least 20 Gauss, and more preferably 60 Gauss, if the intensity of a magnetic field is expressed at the position described above, is needed in order to efficiently introduce a plasma through a magnetic field.

In the above example, the evaporation surface and the coil, both in circular form, are explained, but it is also possible in practice to construct an evaporation surface, a coil and the like in other forms such as a rectangle, when each figure is considered as a cross sectional view. The present invention is not limited as to the length and number of the coils.

For example, the tubular part 3 of FIG. 3a may preferably be extended in the axial direction, thereby extending the coil 1 in the axial direction or putting two or more coils side by side, as long as industrial applicability is not lost. Such modification is essentially not different from the Example of FIG. 3a, but geometric effects thereby obtained can further reduce macroparticles because the distance of introducing a plasma becomes longer.

It is also preferable to arrange an orifice having an opening slightly larger than the diameter of a plasma flow focussed to the inside part of the coil (1) along a magnetic field, by utilizing the action that a focussed plasma beam can be obtained for the same reason described above. The orifice can pass ions introduced through a magnetic field, but it has remarkable blocking effects due to the geometry thereof on neutral macroparticles on which the introducing effects of a magnetic field cannot be exhibited.

An embodiment which is preferable from an economical viewpoint includes an apparatus where at least one part of the magnet coil forming a magnetic field is excited with an arc current.

Figure 3B:
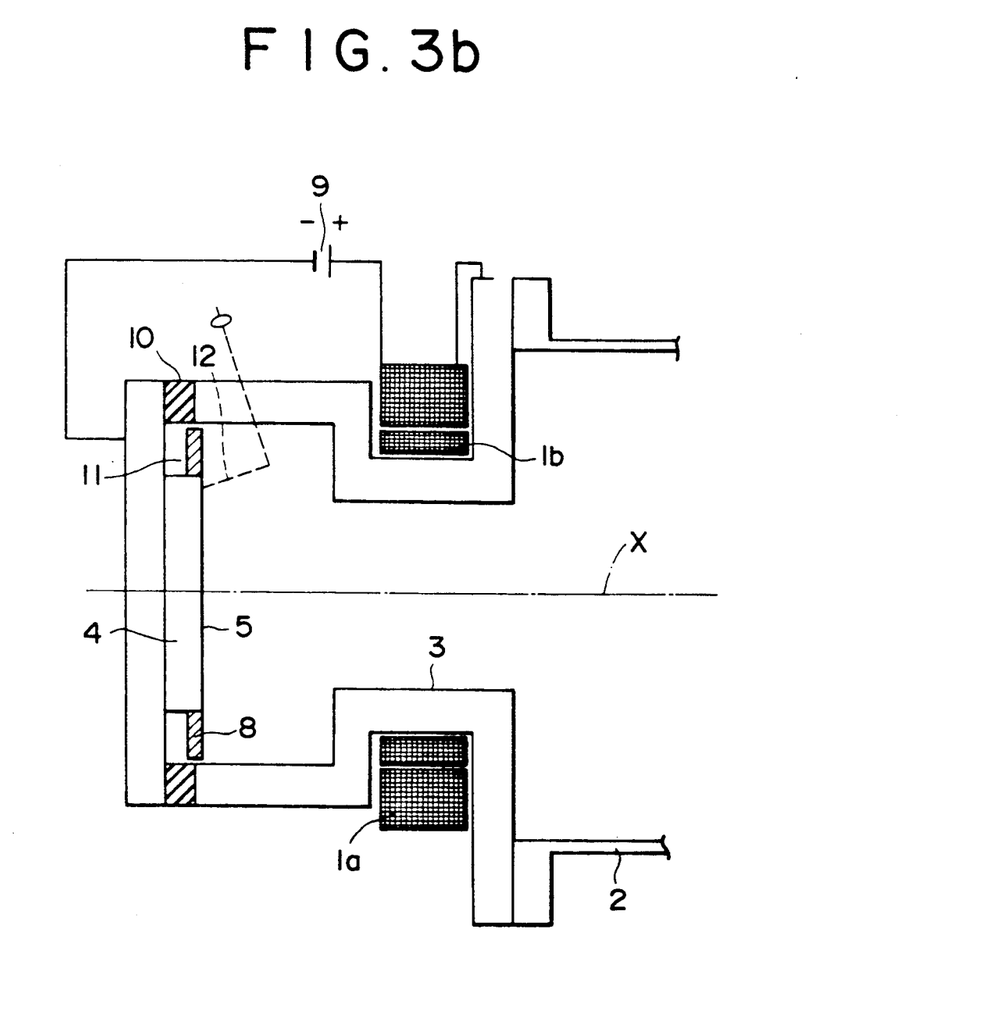
FIG. 3b is a partially enlarged vertical longitudinal sectional side view of the elements of another embodiment of the cathodic arc deposition apparatus of the present invention.

FIG. 3b schematically represents the above embodiment. The numerical figures for illustration are similar to those of FIG. 3a, and duplicate explanation is omitted. Here, the magnet coil is divided into 1a and 1b, with the magnet coil 1a excited with an arc current supplied from an arc evaporation source 9, as is illustrated in the figure. When a cathodic arc discharge is generated at an arc current of 100 A after preparing a coil of 30 turns, an excitation of 3000 AT is possible, which clearly has the same effect as that of the physical phenomenon described above with reference to FIG. 3a. Additionally, according to the embodiment, a specific source is not needed to excite the coils, which is useful for simplifying such system and is also economical.

Coil 1b is not essential, but it can resolve the inconvenience caused by a single coil 1a when used in the separate control of an arc current and a magnetic field. That is, by exciting a certain ratio of a magnetic field with an arc current and then complementing the excitation with coil 1b to obtain a preferable excitation intensity, a separate control can be maintained. On the other hand, the capacity of the exciting source of coil 1b can be greatly reduced, compared with the previous Example, thereby accomplishing economy simultaneously.

The present invention reduces the ratio of macroparticles. Therefore, a preferable result may be obtained by selecting, as evaporation materials, metals of a relatively high melting point, including Ti, Zr, Hf, V, Nb, Ta, Cr, Mo, W and the like, and alloys containing these metals as principal agents, rather than be selecting, as evaporation materials, materials with a low melting point, such as Al and the like, which generate many macroparticles. In other words, in the case of a low melting material originally having a great number of macroparticles, much contamination is caused even if macroparticles are reduced according to the present invention, so that such material lacks practicality as a film. On the other hand, fewer macroparticles are generated in case of high-melting point metals. Furthermore, the vapor of high-melting point metals can be introduced more efficiently by a magnetic field, because the ionization ratio of such metals is higher than that of the other materials.

Still further, many metals having a high-melting point react with elements such as N, C, O, to form compounds having functions of high quality, such as intense hardness. Thus, in many cases, the high-melting point metals are deposited in the presence of reactive gases including nitrogen, hydrocarbon, oxygen and the like. It is often described that the presence of reactive gas during evaporation forms another thin layer of a compound with a higher melting point on an evaporation surface, to suppress the generation of macroparticles. Based on the above fact, the reactive coating under the introduction of reactive gas, using the aforementioned metals as an evaporation material, is the most preferable embodiment of the present invention.

In the experiment using the combination of Ti, Zr and nitrogen gas, the present inventors observed, in the case of a gradual increase of nitrogen gas, a remarkable reduction of the contamination of macroparticles into a film on the boundary of 1 m Torr partial nitrogen pressure, due to the effects of the present invention and nitrogen gas.

The method of the present invention realizes a coating with excellent film quantity as well as fewer macroparticles, under a preferably condition for a substrate bias voltage.

In other words, it was demonstrated during the experiments of the present invention, that the film, which was composed of high-melting point metal compounds and was formed in accordance with the present invention, could dramatically change its property under various substrate bias voltages, and that the control of the substrate bias voltage could achieve the film property of the highest quality criteria conventionally obtained.

For example, in the apparatus of the Example previously mentioned, a substrate was arranged at a position opposite to and 350 mm apart from the evaporation surface to form a TiN film of 2.0-2.5 $\mu$m thickness at coil excitation of 3000 AT, arc current of 100 A, $N_2$ gas pressure of 10 m Torr, and a substrate temperature of 300°-350° C. The film hardness and the results of X ray diffraction analysis of the film are shown in Table 3. As is known from the results, within the range of the substrate bias voltage of $-50$ V to $-150$ V, there is obtained, from TiN of a bulk hardness of 1800 to 2100 kg/mm$^2$, an extremely hard TiN film as hard as 2600 to 3100 kg/mm$^2$, which is considered as the highest quality TiN film the cathodic arc deposition has ever made. Additionally from the results of X ray diffraction analysis, there is obtained, within the range of the substrate bias voltage, a film with a preferred (111) orientation, which has excellent wear resistant property and is suitable for cutting tools. The Japanese Patent Publication No. 502123/1988 proposes the ratio of I(111) to I(200), concerning X ray diffraction intensities of (111) and (200), as an indicator representing the wear resistant property of TiN, and describes that the wear resistant property is excellent if the ratio satisfies the formula I(111)/I(200)>75. Based on the above evaluation standard, the aforementioned bias voltage range is judged excellent, as is known in Table 3. The preferable range of the substrate bias voltage more or less varies in nature, depending on the temperature condition of a substrate and the type of film. As the condition for a hard film, it is appropriately −30 V to −200 V. Preferable results are obtained, specifically at −50 V to −150 V.

A film was formed for decorative use in another example. For decorative use, the deterioration of surface property due to the contamination of macroparticles causes turbidity of the decorative appearance. Therefore, the effects of the present invention can be exhibited most dramatically for this use. In addition, it was demonstrated that color control could be achieved through the substrate bias voltage, in practicing coating with an apparatus of the present invention. For example, a TiN film of 0.5 μm was formed at various substrate bias voltages, under conditions of coil excitation of 3000 AT, arc current of 60 A, and $N_2$ pressure of 10 m Torr while rotating the substrate at a position 400 to 450 mm apart from an evaporation surface. The color toning thus obtained is shown in Table 4. As is known from the table, the apparatus of the present invention could change the color toning at a substrate voltage of −10 V to −100 V, and the color toning was easily controlled. On the other hand, in the case of a substrate voltage exceeding − 150 V, the bombardment effect of ions on a substrate may cause a turbid appearance. Therefore, it is indicated in the present Example, that the control of color toning within the range of the substrate bias voltage of −10 V to −150 V can bring about preferable results, in order to form a decorative film according to the present invention.

TABLE 3

| Substrate voltage (V) | Hardness (kg/mm²) | Orientation I(111)/I(200) | |
|---|---|---|---|
| −10 | 1800 | (200) | 0.03 |
| −20 | 2200 | — | — |
| −30 | 2510 | (200) | 0.17 |
| −50 | 2620 | (111) | infinity |
| −70 | 3100 | (111) | 634 |
| −100 | 3000 | (111) | 136 |
| −150 | 2800 | — | — |
| −200 | 2350 | (111) | infinity |

TABLE 4

| Substrate voltage (V) | Film color |
|---|---|
| −10 | Black |
| −30 | Red-purple |
| −50 | Red-gold |
| −100 | Gold |
| −150 | Gold |
| −200 | Gold |

As has been described above, in accordance with the present invention, a film having minimum contamination by macroparticles from the evaporation surface of cathodic arc deposition and possessing excellent properties can be formed at a high deposition rate. The present invention is superior regarding functions and productivity, and realizes an apparatus in simple and economical structure being constituted along a straight axial line.

Obviously, numerous modifications and variations of the present invention are possible in light of the above teachings. It is therefore to be understood that within the scope of the appended claims, the invention may be practiced otherwise than as specifically described herein.

What is claimed is:

1. A cathodic arc deposition apparatus, comprising:
    an arc evaporation source having an evaporation surface containing a film forming material;
    a substrate surface arranged on a central axis line of and facing the evaporation surface of the arc evaporation source; and
    at least one magnet coil means for generating magnetic field lines arranged around the central axis line and between the arc evaporation source and the substrate and of a configuration whereby the magnetic field lines are constricted in the space between the evaporation surface and the substrate;
    wherein an arc spot generated on the evaporation surface is rotated circularly at a high velocity by a magnetic field generated by the excitation of the at least one magnet coil means and the plasma generated by the arc spot is guided by said magnetic field and is passed through a vacuum space interiorly of the magnet coil means to be introduced onto the substrate surface.

2. The cathodic arc deposition apparatus according to claim 1, wherein:
    the coil means is designed to provide a component of the magnetic field in a radial direction with respect to the central axis and at the evaporation surface of at least 10 Gauss and a magnetic field component parallel to the central axis of at least 20 Gauss.

3. The cathodic arc deposition apparatus according to claim 1, wherein:
    the coil means is designed to provide an axial component of the magnetic field at the evaporation surface of at least 60 Gauss.

4. A cathodic arc deposition apparatus, comprising:
    an arc evaporation source containing a film forming material;
    a first vacuum chamber containing the arc evaporation source;
    a substrate having an unobstructed path directly to an evaporation surface of the arc evaporation source, a line which passes through the substrate and the evaporation surface defining a central axis;
    a second vacuum chamber containing the substrate;
    a tubular part between the first and second vacuum chambers connecting the first vacuum chamber to the second vacuum chamber; and
    at least one magnet coil means for generating magnetic field lines arranged on a circumference of the tubular part and of a configuration whereby the magnetic field lines are constricted in the space between the evaporation surface and the substrate.

5. The cathodic arc deposition apparatus according to claim 4, wherein the coil means includes at least two magnet coils which are arranged side by side on the circumference of the tubular part, along the central axis line of the evaporation surface of the arc evaporation source.

6. The cathodic arc deposition apparatus according to claim 4, wherein the tubular part is an orifice having an opening slightly larger than the diameter of a plasma flow focussed by a magnetic field generated by the excitation of the at least one magnetic coil means.

7. The cathodic arc deposition method according to claim 1 or 4, further comprising:
providing a cathode that contains at least one metal selected from Ti, Zr, Hf, V, Nb, Ta, Cr, Mo, W, and alloys thereof.

8. A cathodic arc deposition method for forming a film, comprising the steps of:
generating an arc plasma between an anode and a cathode, said cathode being an arc evaporation source;
evaporating a portion of an evaporation surface of said cathode due to heating of said portion by the arc plasma impinging upon said portion;
positioning a substrate surface to be facing said arc plasma and to have an unobstructed path directly between said substrate surface and said evaporation surface, a line from the center of said substrate surface through said cathode defining a central axis;
arranging at least one magnetic coil at a coaxial position on the central axis and between said substrate surface and the evaporation source, said at least one magnetic coil configured so that the magnetic field lines are constricted in the space between the evaporation surface and the substrate;
rotating the arc spot circularly at a high velocity, by application of forces on the arc generated by a magnetic field component along a radial direction with respect to the central axis of the magnetic field;
passing the plasma generated from the arc spot through a vacuum space inside the coil along the magnetic lines of force of the magnetic field to be introduced onto the substrate for coating.

9. A cathodic arc deposition method, comprising the steps of:
arranging an arc evaporation source containing a film forming material as a cathode and a substrate in a vacuum chamber so that there are no obstructions directly between the substrate and the evaporation source;
generating a magnetic field so that magnetic field lines are constricted in the space between the evaporation surface and the substrate;
generating an arc spot on the evaporation surface of the arc evaporation source;
circularly rotating the arc spot at a high velocity on the evaporation surface of the arc evaporation source, due to interaction of the arc with the magnetic field; and
introducing the plasma generated by the arc spot onto the substrate by guiding the plasma along the magnetic lines of force of the magnetic field.

10. The cathodic arc deposition method according to claim 9, wherein the film forming material is at least one metal material selected from Ti, Zr, Hf, V, Nb, Ta, Cr, Mo, W, and alloys thereof, and a reactive gas to react with the metal materials is introduced into the vacuum chamber.

11. The cathodic arc deposition method according to claim 10, wherein the partial pressure of the reactive gas is 1 m Torr or more.

12. The cathodic arc deposition method according to claim 10, wherein the film forming material is at least one metal material selected from Ti, Zr, and alloys thereof, and the reactive gas is a gas containing nitrogen gas, the partial pressure of the nitrogen gas being 1 m Torr or more.

13. The cathodic arc deposition method according to claim 9, wherein a bias voltage in the range of $-30$ V to $-150$ V is applied to the substrate.

14. The cathodic arc deposition method according to claim 9, wherein a bias voltage applied to the substrate is controlled, thereby making the film to be formed on the substrate exhibit a desired color toning.

15. A cathodic arc depositon apparatus, comprising:
an arc evaporation source having an evaporation surface;
a substrate surface arranged to be facing the evaporation surface of the arc evaporation source; and
a magnetic coil means for producing a magnetic field arranged between the arc evaporation source and the substrate and of a configuration whereby the magnetic field lines are constricted in the space between the evaporation source and the substrate.

16. An apparatus according to claim 15, further comprising:
an inner diameter of a vacuum chamber that is surrounded by the coil means which is smaller than a largest diameter of the the evaporation surface.

17. A cathodic arc deposition method for forming a film, comprising the steps of:
positioning a substrate surface to be spaced away from and facing an evaporation surface of an arc evaporation source;
arranging a magnetic coil between the substrate surface and the evaporation surface and configuring said at least one magnetic coil so magnetic field lines created thereby are constricted in the space between the evaporation surface and the substrate; and
generating an arc plasma between an anode and the evaporation surface, said evaporation surface acting as a cathode.

18. An apparatus according to claim 17, wherein:
an inner diameter of a vacuum chamber which is surrounded by said magnetic coil is smaller than a largest diameter of the the evaporation surface.

* * * * *